Figure 1:
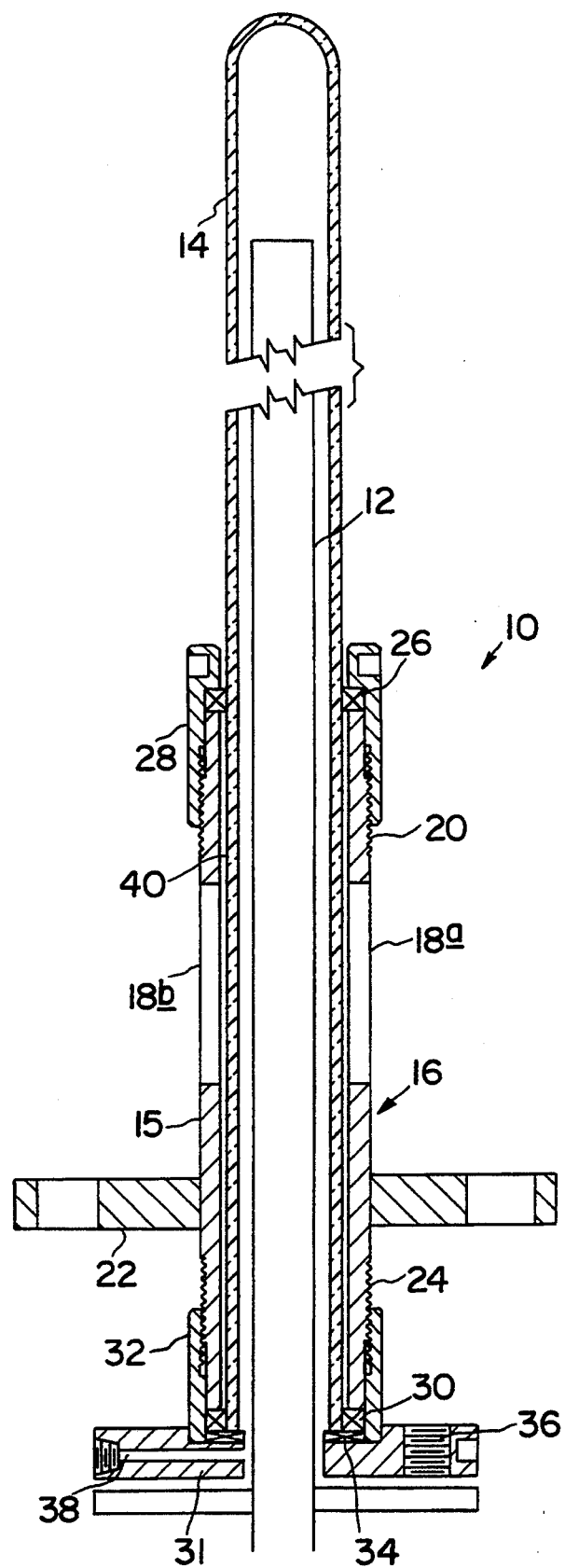

United States Patent [19]

Ibrahim et al.

[11] Patent Number: 5,358,603
[45] Date of Patent: Oct. 25, 1994

[54] PROCESS FOR THE REMOVAL OF A SILICON COATING FROM A SURFACE

[75] Inventors: Jameel Ibrahim, Humble; Richard J. Fendley, Seabrook; Troy E. DeSoto, Houston, all of Tex.; Jerry G. Hitchens, Baton Rouge, La.

[73] Assignee: Albemarle Corporation, Richmond, Va.

[21] Appl. No.: 957,319

[22] Filed: Oct. 6, 1992

[51] Int. Cl.⁵ .......................................... H01L 21/312
[52] U.S. Cl. ..................... 156/657; 134/22.11; 134/8; 134/1; 134/3; 156/643; 156/646; 156/345
[58] Field of Search .................... 134/22.11, 8, 1, 3; 156/643, 646, 657, 345

[56] References Cited

U.S. PATENT DOCUMENTS

| | | | |
|---|---|---|---|
| 3,042,494 | 7/1962 | Gutsche | 427/51 |
| 4,444,812 | 4/1984 | Gutsche | 427/255 |
| 4,529,474 | 7/1985 | Fujiyama | 156/643 |
| 4,558,660 | 12/1985 | Nishizawa | 118/725 |
| 4,576,698 | 3/1986 | Gallagher | 204/192 |
| 4,657,616 | 4/1987 | Benzing | 156/345 |
| 4,786,352 | 11/1988 | Benzing | 156/345 |
| 5,109,562 | 5/1992 | Albrecht | 15/56 |

Primary Examiner—R. Bruce Breneman
Assistant Examiner—Joni Chang
Attorney, Agent, or Firm—Edgar E. Spielman, Jr.

[57] ABSTRACT

This invention relates to a process for etching a silicon coat on the inside wall of a tube. The tube may be a product discharge tube associated with a fluidized bed reactor used in the thermal production of silicon from a silicon containing compound, e.g., silane. The process features: a) heating the silicon coat to a temperature within the range of from about 500° to about 750° C., such heating occurring principally with radiant heat from a heating means inserted within the interior of the tube; and (b) contacting the heated silicon coat with a mineral acid which etches the heated silicon coat.

4 Claims, 1 Drawing Sheet

PROCESS FOR THE REMOVAL OF A SILICON COATING FROM A SURFACE

BACKGROUND OF THE INVENTION

This invention relates to a new process for attenuating or removing a silicon coating from the inside surface of a tube. The process of this invention is particularly useful in the art of producing polysilicon granules, which granules are convertible to monocrystalline silicon.

High purity monocrystalline silicon is in great demand as a semiconductor material. The purity of the silicon is critical as impurities, especially metal and hydrogen, can render the silicon unacceptable for some electronic uses.

Most of the world's supply of semiconductor grade silicon is produced from polycrystalline silicon, i.e., polysilicon, which in turn is produced from the thermal decomposition of a silicon source, e.g., silane, trichlorosilane and the like. The thermal decomposition can conveniently be carried out in a fluidized bed reactor into which is fed the silicon source material and a carrier or fluidizing gas. Such processes are exemplified in U.S. Pat. Nos. 4,784,052, 4,784,840, 4,868,013 and 4,883,687, which patents are all incorporated herein as if fully set forth. The polysilicon product from these processes is a free flowing powder comprised of essentially spherical polysilicon granules having a particle size range of from about 150 to about 3000 microns. Average particle size is from about 600 to about 1100 microns.

The fluidized bed process provides for a periodic discharging of the finished polysilicon granules from the reactor after the granules have reached a desired average size. This discharging occurs via a product withdrawal tube which is mounted in the bottom of the reactor. The mounting is conveniently achieved by fixing the upper end of the tube to the distributor plate, through which plate the fluidizing gas is introduced into the reactor. The product withdrawal tube will usually have a narrow inside diameter, say from about 1.5 to about 2.5 inches.

While the fluidized bed technology is advantageous in many respects, it is not without its drawbacks. When silane, a preferred silicon source material, is thermally decomposed in the reactor, the resultant silicon can deposit heterogeneously, i.e., deposit on a surface, or it can deposit homogeneously, i.e., form a silicon dust without a substrate. The former is the mechanism by which the desired granular product is grown. The initial growth, i.e., depositing, occurs on the silicon seed particles fed to the reactor. Unfortunately, this deposition occurs not only on the seed particles but also on the reactor and product withdrawal tube surfaces as well. Facilitating this deposition is the fact that these surfaces are generally of a material which is silicon related. The use of silicon related materials is preferred since such use promotes the obtainment of a very pure final polysilicon product.

The silicon deposition on the reactor and tube surfaces can continue over time until the coating builds to a thickness which adversely affects the functional characteristics of the reactor and/or tube. When the coating becomes too thick, the practice has been to shut the reactor down and to remove or reduce the coating by etching the coating with a mineral acid, such as hydrochloric acid. This etching occurs slowly, but can be accelerated by heating the silicon coating to a temperature of about 500° to about 1000° C. The coating on the reactor walls can be heated by simply using the same equipment used to heat the reactor for the thermal decomposition of the silane to silicon. Heating of the coating on the inside surface of the product withdrawal is more problematical. When the equipment used to heat the reactor is relied upon to heat the interior of the tube, the heat transfer access between the reactor and tube is poor at best. Convective heat transfer is not effective since the mineral acid, which is introduced at the top of the reactor, does not have sufficient heat capacity to heat the product withdrawal tube to the necessary temperature. Conductive heat transfer, while it does occur to some extent, is not favored as the distributor to which the tube is mounted is cooled to prevent its damage. Radiant heat transfer is frustrated by the geometry existing between the reactor and associated product withdrawal tube. With the product withdrawal tube at a relatively low temperature, the etching occurring therein is slow and can extend the time needed to effect the coat reduction sought.

One technique used to speed up the etching in the tube is to dismantle the tube and remove it from the distributor so that the tube or at least portions thereof can be conventionally heated away from the reactor. While this technique can work some of the time, it is not a panacea. Many times the tube is not easily removed from the distributor due to the extent of the silicon build-up. (Generally the silicon build-up will be worst at the distributor-tube juncture.) Also, the product withdrawal tube will almost always be of a fragile material, such as silicon carbide, silicon, quartz, etc., which can make tube damage a real concern.

Therefore, there is a need for a process for the attenuation or removal of a silicon coating from the inside wall of a product withdrawal tube, which process does not require removal of the tube from its association with the fluidized bed reactor and which does not put the tube in jeopardy of being damaged.

THE INVENTION

This invention relates to a method for etching a silicon coating about the interior surface of a product withdrawal tube, The etching can occur while the tube is maintained in association with a fluidized bed reactor and with little concern for damaging the tube. The process features: heating the silicon coat to a temperature within the range of from about 500° to about 750° C., such heating occurring principally with radiant heat from a heating means inserted within the interior of the tube; and etching the heated silicon coat by contacting same with a mineral acid.

The heating means preferably comprises electrical heating element(s) which are housed within an elongated, tubular housing. The housing is dimensioned so that it can fit within the bore of the coated tube and preferably extend to a point substantially adjacent the juncture between the product discharge tube and the distributor. So that contamination of the reactor is minimized, it is preferred that the housing be manufactured from a non-contaminating material, such as silicon, quartz, silicon carbide and the like. The housing can house a single heating element or a plurality of heating elements. In some cases the use of multiple heating elements is preferred as better control of the temperature profile over the length of the coated tube is obtainable. It is preferred that the heating means be mounted in a stationary position during the etching period. Such mounting is achieved by providing the heating means with structure at its proximate end for mounting of the heating means to the reactor assembly.

The preferred mineral acid for etching the silicon is hydrochloric acid. Other suitable mineral acids are exemplified by HF, and the like. Other oxidizing agents such as $Cl_2$ can be used. For a mineral acid to be suitable for the process of this invention it is only required that the acid be able to effect etching of the silicon coating under reaction conditions and that the acid not contaminate the surfaces with which it comes into contact. It is preferred that the acid be fed into the proximate end of the product discharge tube and that it exit the distal end of that tube. With this point of discharge, the remaining acid is available to effect etching of the silicon coating on the reactor walls. It is an advantage that the discharged acid is relatively hot due to its passing through the heated product discharge tube since this heat contributes to the total amount of heat needed by the reactor portion for its etching process.

The mineral acid can be used in the anhydrous form or in a gaseous mix with $H_2$ or Ar. If the gaseous mix is used and the mineral acid is HCl, the gaseous mix will contain from about 100 to about 50 mole % acid.

The flow rate of mineral acid through the tube with the heating means located therein should be that rate which will insure sufficient acid to optimize the silicon-mineral acid reaction. Thus, the rate used is dependent upon the concentration of the acid per volume fed to the tube and upon the etching temperature selected. Generally, the flow rate is preferably within the range of from about 20 lb/hr to about 200 lb/hr.

To better understand the features of a preferred heating element for use in the process of this invention the following description and accompanying drawing are provided.

BRIEF DESCRIPTION

FIG. 1 is a broken, vertical section of a heating means suitable for use in a process of this invention.

Referring now to FIG. 1 there is shown a heating means, generally designated by the numeral 10, which includes a heating element portion 12, a tubular housing portion 14 and a mounting assembly, generally designated by the numeral 16.

Heating element 12 is shown figuratively and can be any element capable of heating tubular housing portion 14. It is preferred that heating element 12 be an electrical heating element as the output of such elements is easy to control. As mentioned previously the heating element can be comprised of a plurality of separate heating elements. When a plurality of heating elements is used, greater control of the heat output along the length of the heating means is possible. Since the process of this invention is most conveniently run at the same time that the reactor etching process is run, such control is beneficial as adjustment can be made for the reactor heat which does reach certain portions of the product discharge tube. When electrical heating elements are used, their design, wiring and control mechanisms are conventional, there being no criticality associated therewith.

Tubular housing 14 encloses heating element 12. For the embodiment shown in the drawing, tubular housing 14 has a distal end which is closed off by a hemispherical wall. Tubular housing 14 is designed to have a diameter and a length which will allow for its insertion into the interior of the product withdrawal tube without making contact with the coated walls of the tube. The length of tubular housing 14 is such that it can penetrate far into the product discharge tube, preferably all the way to a point adjacent the distributor-tube juncture. Generally, tubular housing 14 will have a diameter within the range of from about 1.0 to about 2.0 inches, and a length within the range of from about 65 to about 75 inches. The wall thickness of tubular housing 14 should be sufficient to insure that the housing is not particularly fragile but not so thick as to place an excessive heat duty on the heating elements.

As mentioned previously, obtaining a very pure silicon product is a primary objective of the polysilicon process. To this end, every precaution should be taken against contaminating the process equipment. Thus, the heating means used in the process of this invention must also be non-contaminating to the extent which is reasonably possible. Contamination can occur by contact between the interior of the product withdrawal tube and heating means 10 and by vapors given off by heating means 10. As also mentioned previously, to avoid such contamination, it is preferred that tubular housing 14 be constructed of a non-contaminating material, such as quartz, silicon carbide, silicon carbide coated graphite and the like. Most preferred is quartz.

Tubular housing 14 is carried by mounting assembly 16 which in turn is designed for being rigidly mounted with respect to the product withdrawal tube. This mounting can be to the fluidized bed reactor structure, or to structure related to the product discharge tube. The effect of this mounting is to provide for the safe and efficient feed of the mineral acid into the interior of the product discharge tube. Mounting assembly 16 comprises a mounting base 31 which has a bore at its center through which the wires, etc., needed to operate and control heating element 12 can pass. Mounting base 34 has a plurality of equiangularly spaced threaded bores for fixing mounting base to the selected rigid structure. One of these threaded bores is shown in the drawing and designated by the number 36. Upstanding from mounting base 34 is threaded collar 32. Threaded onto collar 32 is mounting tube 15 which has a threaded lower portion 24. Above threaded lower portion 24 is flange 22 which is configured and dimensioned to aid in obtaining a rigid mount along with mounting base 34. For the embodiment shown in the drawing, mounting tube 15 is provided with a plurality of equiangularly displaced slots, two of which are shown in the drawings and designated, respectively, by the numerals 18a and 18b. These slots function to vent the space between tubular housing 14 and mounting tube 15.

Mounting tube 15 has a threaded portion 20 at its upper end which obtains a threaded fit with collar 28. This threaded fit acts to compress annular gasket 26 so that it squeezes onto tubular housing 14 to achieve a snug mount between it and mounting tube 15. A similar type of snug mount is achieved at the proximate end of tubular housing 14 between it and annular gasket 30 and threaded of collar 32 as a result of compressing gasket 30 via the threading of mounting tube onto threaded collar 32. Additionally, this threading acts to provide for a gas seal, via annular gasket 34, between the open end of tubular housing 14 and mounting base 31.

As heating element 12 begins to heat the gases, e.g., air, in the space 40 between heating element 12 and tubular housing 14 will begin to expand. The resultant pressure increase could cause damage to the relatively fragile tubular housing. To relieve this pressure before it causes damage, there is provided exhaust port 38 in mounting base 31. Exhaust port 38 is vented to the atmosphere exhausting gas from space 40 via exhaust port 38.

With the above detailed description of this invention a skilled practitioner can make many changes or modifications without departing from the scope and spirit of the appended claims.

We claim:

1. A process for etching a silicon coating from a product withdrawal tube, which tube is used to discharge polysilicon granules from a fluidized bed reactor, the process comprising:

(a) shutting down the reactor;

(b) inserting a heating means into the interior of the withdrawal tube while the withdrawal tube is still associated with the reactor;

(c) using the heating means to heat the silicon coat about the interior wall of the withdrawal tube whereby the coat is heated to a temperature within the range of from about 500° C. to about 750° C.; and (d) etching the heated coat with a mineral acid.

2. The process of claim 1 wherein the heating of the silicon coating is effected by inserting a tubular, elongated heater within the interior of the product withdrawal tube.

3. The process of claim 1 wherein the mineral acid is hydrochloric acid.

4. The process of claim 3 wherein the heating of the silicon coating is effected by inserting a tubular, elongated heater within the interior of the product withdrawal tube.

* * * * *